United States Patent
Wang et al.

(10) Patent No.: US 7,235,442 B2
(45) Date of Patent: Jun. 26, 2007

(54) METHOD FOR FABRICATING CONDUCTIVE LINE

(75) Inventors: Pin-Yao Wang, Hsinchu (TW); Liang-Chuan Lai, Hsinchu County (TW); Jeng-Huan Yang, Hsinchu (TW)

(73) Assignee: Powerchip Semiconductor Corp., Hsinchu (TW)

( * ) Notice: Subject to any disclaimer, the term of this patent is extended or adjusted under 35 U.S.C. 154(b) by 0 days.

(21) Appl. No.: 11/164,950

(22) Filed: Dec. 12, 2005

(65) Prior Publication Data

US 2007/0010053 A1    Jan. 11, 2007

(30) Foreign Application Priority Data

Jul. 6, 2005    (TW) ............................... 94122796 A

(51) Int. Cl.
*H01L 21/336* (2006.01)
(52) U.S. Cl. ...................... 438/257; 438/211
(58) Field of Classification Search ................ 438/211, 438/257, 264, 290, 295, 300
See application file for complete search history.

(56) References Cited

U.S. PATENT DOCUMENTS 6,420,220 B1 *   7/2002   Gardner et al. ............. 438/151
6,893,918 B1 *   5/2005   Wang et al. ................ 438/257

* cited by examiner

*Primary Examiner*—Phuc T. Dang
(74) *Attorney, Agent, or Firm*—Jiang Chyun IP Office

(57) ABSTRACT

A method for fabricating a conductive line is provided. First, a substrate having at least two isolation structures already formed is provided. A first conductive layer is formed between every two isolation structures. Then, a dielectric layer is formed on the substrate. The dielectric layer is patterned to form an opening exposing the first conductive layer. After that, a second conductive layer is formed on the substrate. A portion of the second conductive layer outside the opening is removed to form a conductive line. As the size of the device is getting smaller, the size and the position accuracy of the conductive line would not be limited to the design rules of lithography if the present invention is applied. Therefore, a conductive line is formed to electrically connect semiconductor devices effectively.

23 Claims, 7 Drawing Sheets

METHOD FOR FABRICATING CONDUCTIVE LINE

CROSS-REFERENCE TO RELATED APPLICATION

This application claims the priority benefit of Taiwan application serial no. 94122796, filed on Jul. 6, 2005. All disclosure of the Taiwan application is incorporated herein by reference.

BACKGROUND OF THE INVENTION

1. Field of Invention

The present invention relates to a semiconductor device and the fabricating method of semiconductor device. More specifically, the present invention relates to the structure of a conductive line and the fabricating method of the same.

2. Description of Related Art

Nowadays, integrated circuit technology is fast advancing, and device minimization and integration are an inevitable trend. While the device size is getting smaller, the size and line width of conductive lines for connecting devices are becoming smaller accordingly. As a result, the difficulty of the fabricating process is increased.

Take the memory fabricated in the silicon wafer as an example, after forming memory cells on the silicon wafer, conductive lines (word line) have to be formed to connect memory cells, so that the memory can work properly.

FIG. 1A is a top view of a flash memory array. The isolation structure 110 of the flash memory array has a stripe layout. The isolation structure 110 is used to define the active area 120. Conductive line 150a (word line) is formed on the active area 120. In the conventional technology, the conductive line 150a is formed by using lithography and etching technology.

FIG. 1B is a cross-sectional view along line P–P' in FIG. 1A. As shown in FIG. 1B, an isolation structure 110, a tunneling oxide layer 130 and a conductive material layer 140 have been formed in the substrate 100. The isolation structure 110 is between two active areas 120. The tunneling oxide layer 130 and conductive material layer 140 are disposed on the active areas 120. The conductive material layer 140 and its covered active areas 120 have a plurality of semiconductor devices formed thereon (not shown). Next, another layer of conductive material layer (not shown) is formed over the substrate 100 to cover the isolation structure 110 and the conductive material layer 140. Then, the conductive material layer is patterned by using a lithography and etching process, and an opening 165 exposing the isolation structure 110 is formed, so that the conductive lines 150a (word line) connecting memory cell array illustrated in FIG. 1B are fabricated.

However, because of the limitation of the optical design rule of lithography, the method of fabricating the conductive line 150a using lithography and etching process can not be made with smaller size. Moreover, the pattern accuracy of the conductive line 150a is also affected by the accuracy of exposure. In other words, when the exposure mask position or exposure light source angle shifts, the exposure pattern position shifts accordingly, therefore the accuracy of fabricating conductive line 150a position is affected. For example, when the photoresist mask 170 used for fabricating conductive line 150a shifts and dry etching process is used to remove a portion of conductive material layer to form the conductive line 150a, the conductive layer 140 may be damaged or even the tunneling oxide layer 130 (as shown in FIG. 1C) is damaged. As a result, the electrical connection between devices are affected, therefore the devices can not work properly.

SUMMARY OF THE INVENTION

The object of the present invention is to provide a conductive line structure and a fabricating method thereof, suitable for fabricating a conductive line with smaller size and higher position accuracy.

Base on above or other objects, the present invention provides a fabricating method of conductive line. First, a substrate is provided. A plurality of isolation structures protruding from the substrate surface is formed in the substrate. And a first conductive layer is formed between two adjacent isolation structures. Next, a dielectric layer is formed on the substrate, and the dielectric layer is patterned to form a first opening exposing the first conductive layer. A second conductive layer is formed on the substrate. Lastly, a portion of the second conductive layer outside the first opening is removed to form a conductive line which electrically connects the first conductive layer.

According to an embodiment of the present invention, the material of above first conductive layer and the second conductive layer includes doped polysilicon or metal.

According to an embodiment of the present invention, the forming method of the first conductive layer and the second conductive layer includes a physical vapor deposition (PVD) process or a chemical vapor deposition (CVD) process.

According to an embodiment of the present invention, the method of removing a portion of the second conductive layer includes a chemical mechanical polishing (CMP) process or an etching back process.

According to an embodiment of the present invention, the forming method of above isolation structure includes a Shallow Trench Isolation (STI) process.

According to an embodiment of the present invention, the dielectric layer includes a first dielectric layer and a second dielectric layer formed above the first dielectric layer.

According to an embodiment of the present invention, the material of the first dielectric layer and the second dielectric layer includes a material with an etching selectivity different from that of the material of the first conductive layer. The material of the first dielectric layer includes the material with an etching selectivity different from that of the material of the isolation structure.

According to an embodiment of the present invention, the material of the first dielectric layer includes silicon nitride.

According to an embodiment of the present invention, the material of the second dielectric layer includes silicon oxide.

According to an embodiment of the present invention, before the dielectric layer is formed on the substrate, a plurality of trench devices is formed in the first conductive layer. The trench device includes a tunneling oxide layer, a control gate, two floating gates and an inter-gate dielectric layer. The tunneling oxide layer is disposed on the surface of the trenches in the substrate. The floating gate is disposed on two sides of control gate. And the inter-gate dielectric layer is located between the control gate and two floating gates.

According to an embodiment of the present invention, the conductive line is word line.

According to an embodiment of the present invention, the method of forming the isolation structure and the first conductive layer includes following steps. A conductive material layer is formed on the substrate. A mask layer is formed on the conductive material layer. Then the mask layer and the conductive material layer are patterned to form a patterned mask layer, the first conductive layer and at least two second openings that expose the substrate. Next, the patterned mask layer is used as a mask to remove a portion of the substrate, so that at least two trenches are formed in the substrate. After this, an insulator material layer is formed on the substrate, and a portion of the insulator material layer is removed in a chemical mechanical polishing (CMP) process, until the patterned mask layer is exposed. Next, the patterned mask layer is removed.

Since the material of the first dielectric layer and the isolation structure of the present invention have different etching selectivity, the isolation structure can be used as a self-aligned mask when the first dielectric layer is patterned to form the opening exposing the first conductive layer. Moreover, since the material of the first dielectric layer and the material of the first conductive layer have different etching selectivity, the first conductive layer would not be damaged even if misalignment occurs, therefore the method of the present invention can increase the process margin. Meanwhile, since the fabricating method of the conductive line in the present invention can be further combined with the self-aligned shallow trench isolation (SASTI) process, the reliability of the whole structure can be further increased.

The present invention further provides a fabricating method of a conductive line, which includes the following steps. A substrate is provided, then the conductive material layer and the mask layer are formed sequentially on the substrate. Next, the mask layer and the conductive layer are patterned to form the patterned mask layer, the first conductive layer and at least two first openings which expose the substrate. Then a portion of the substrate is removed by using the patterned mask layer as the mask, so that at least two trenches are formed in the substrate. An insulator material layer is formed in the trenches, and then the patterned mask layer is removed. A first dielectric layer is formed on the substrate, and the first dielectric layer is patterned so that the second opening which exposes the first conductive layer is formed between the insulator material layers. A second conducive layer is formed in the second opening, and a portion of the second conductive layer outside the second opening is removed, so that the conductive line that electrically connects the first conductive layer is formed.

According to an embodiment of the present invention, further includes forming a second dielectric layer on the first dielectric layer. Wherein, the material of the first dielectric, for example, is a material with an etching selectivity different from the second dielectric layer. In addition, the material of the first dielectric, for example, is a material with an etching selectivity different from the first conductive layer and the insulator material layer. The material of the first dielectric layer, for example, is silicon nitride. The material of the second dielectric layer, for example, is silicon oxide.

According to an embodiment of the present invention, the material of the first conductive layer and the second conductive layer, for example, is doped polysilicon or metal. The method of forming the first conductive layer and the second conductive layer, for example, is a physical vapor deposition (PVD) process or chemical vapor deposition (CVD) process.

According to an embodiment of the present invention, the method of removing a portion of the second conductive layer, for example, is a chemical mechanical polishing process or an etching back process.

According to an embodiment of the present invention, before forming a first dielectric layer on the substrate, a plurality of trench devices are further formed in the first conductive layer. And the trench device includes a tunneling oxide layer, a control gate, two floating gates and an inter-gate dielectric layer. The tunneling oxide layer is disposed on the surface of the trenches in the substrate. The two floating gates are located on two sides of the control gate. The inter-gate dielectric layer is formed between the control gate and two floating gates.

According to the conductive line fabrication method of the embodiment of the present invention, the conductive line is a word line.

Since the fabricating method of the conductive line of the present invention can be combined with the self-aligned shallow trench isolation (SASTI) process, the reliability of the whole structure can be further increased. And since the material of the first dielectric layer and the material of the isolation structure of the present invention have different etching selectivity, the isolation structure can be used as a self-aligned mask when the first dielectric layer is patterned to form the opening that exposes the first conductive layer. Moreover, since the material of the first dielectric layer and the material of the first conductive layer have different etching selectivity, the first conductive layer would not be damaged even if misalignment occurs, therefore the process margin can be increased in the present invention.

In order to the make the aforementioned and other objects, features and advantages of the present invention comprehensible, a preferred embodiment accompanied with figures is described in detail below.

DESCRIPTION OF EMBODIMENTS

First Embodiment

Figure 1A:
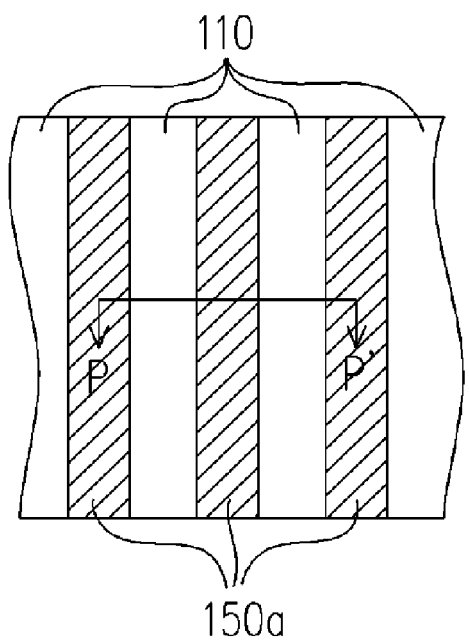
FIG. 1A is a schematic top view of a flash memory array.
Figure 1B:
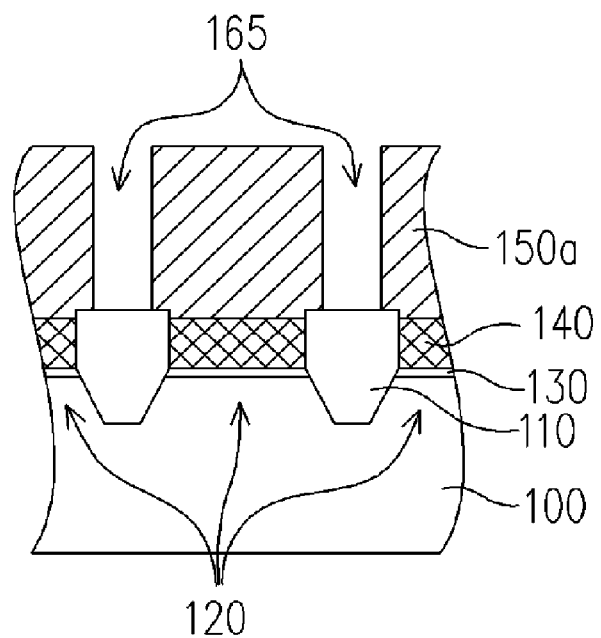
FIG. 1B and FIG. 1C are schematic cross-sectional views along the line P–P' in FIG. 1A, illustrating the fabricated conductive line.
Figure 1C:
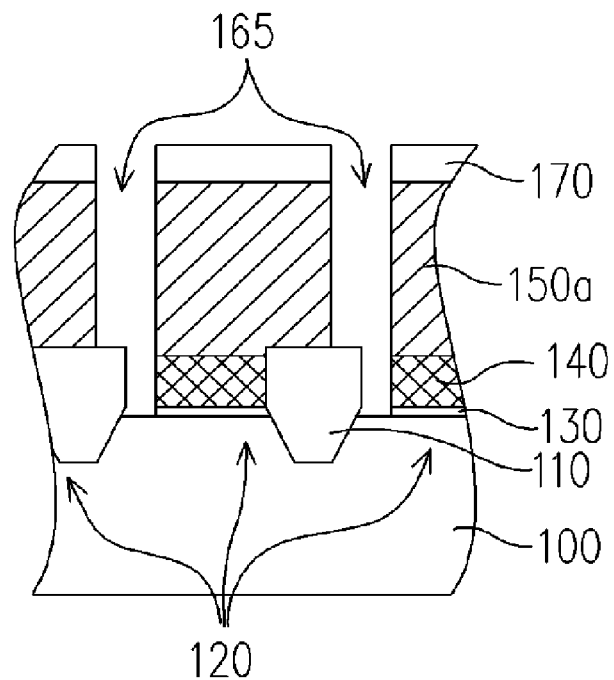
Figure 2:
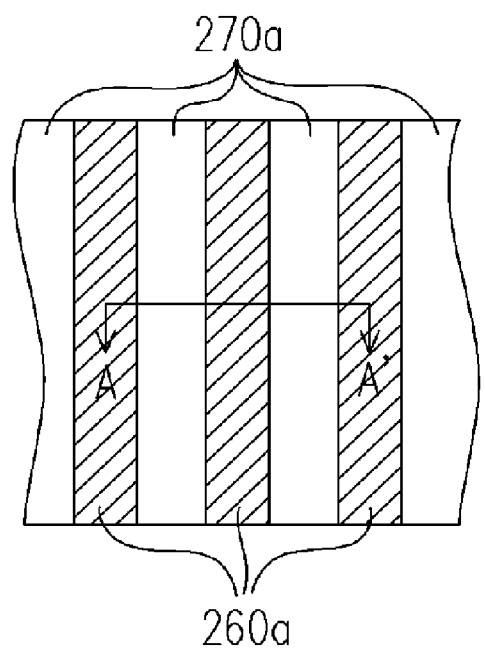
FIG. 2 is a schematic top view of a flash memory array.

FIG. 2A~FIG. 2G are schematic cross-sectional views along the line A–A' in FIG. 2, illustrating the flowchart of fabricating the conductive line.

Figure 2A:
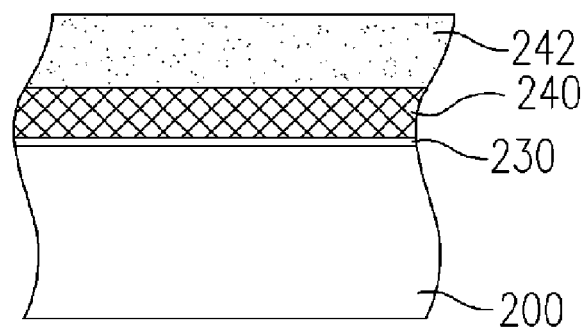
FIG. 2A to FIG. 2I are schematic cross-sectional views along the line A–A' in FIG. 2, illustrating the flowchart of fabricating the conductive line.

As shown in FIG. 2A, a substrate 200 is provided. On the substrate 200, an oxide layer 230, a conductive material layer 240 and a mask layer 242 are formed in sequence. The material of the oxide layer 230, for example, is silicon oxide. The material of conductive material layer 240, for example, is doped polysilicon or metal. And the material of mask layer 242, for example, is silicon nitride. The forming method of the oxide layer 230, for example, is a thermal oxidation process. The forming method of the conductive material layer 240 and the mask layer 242, for example, is a physical vapor deposition (PVD) or a chemical vapor deposition (CVD) process.

Figure 2B:
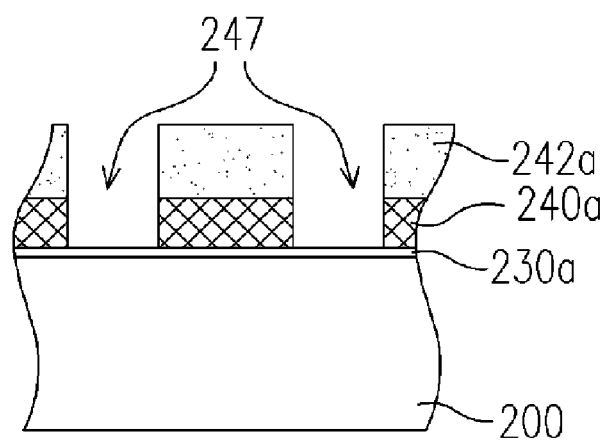

As shown in FIG. 2B, the mask layer 242, the conductive material layer 240 and the oxide layer 230 are patterned by using a dry etching process, for example, so as to form the patterned mask layer 242a, conductive layer 240a, tunneling oxide layer 230a and at least two openings 247 which expose the substrate 200.

Figure 2C:
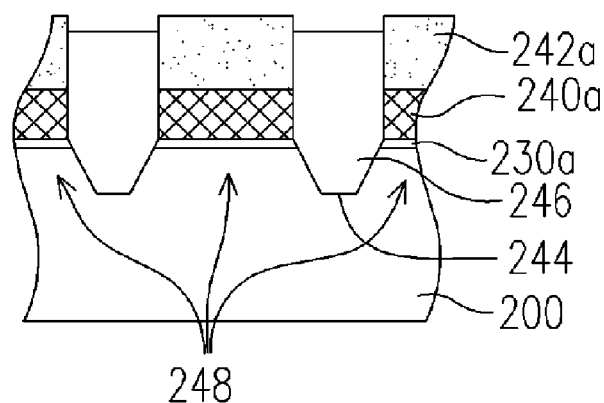

As shown in FIG. 2C, the a portion of the substrate 200 is removed by using patterned mask layer 242a as a mask, so that at least two trenches 244 are formed in the substrate 200. The method of removing a portion of the substrate 200, for example, is a dry etching process. Next, an insulator material layer (not shown) is formed on the substrate 200 to fill up the trenches 244. The material of the insulator material layer, for example, is silicon oxide. The method of forming the insulator material layer, for example, is a chemical vapor deposition (CVD) process. Then, a portion of the insulator material layer is removed by using a chemical mechanical polishing method, until the patterned mask layer 242a is exposed, so that the isolation structure 246 is formed to defined the active area 248.

Figure 2D:
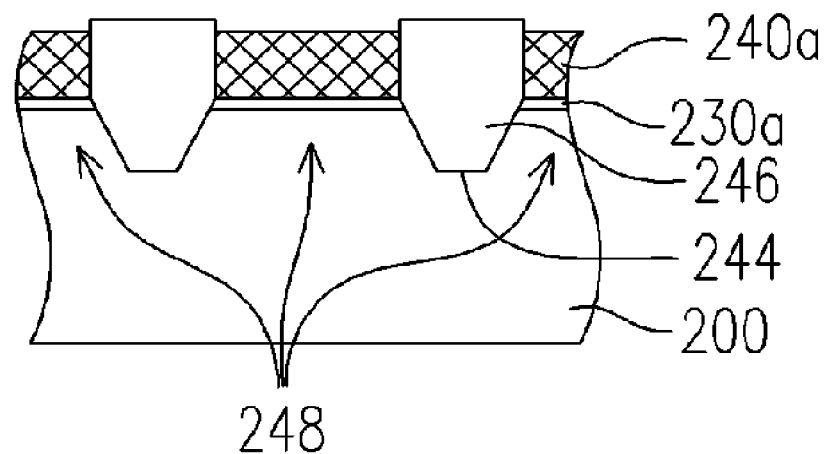

As shown in FIG. 2D, the patterned mask layer 242a and a portion of the insulator material layer are removed. The method of removing patterned mask layer 242a and a portion of the insulator material layer, for example, is a wet etching process. In the present embodiment, the SASTI is used to describe the forming method of the isolation structure 246. Of course, the forming method of the isolation structure 246 can also be STI.

Figure 2E:
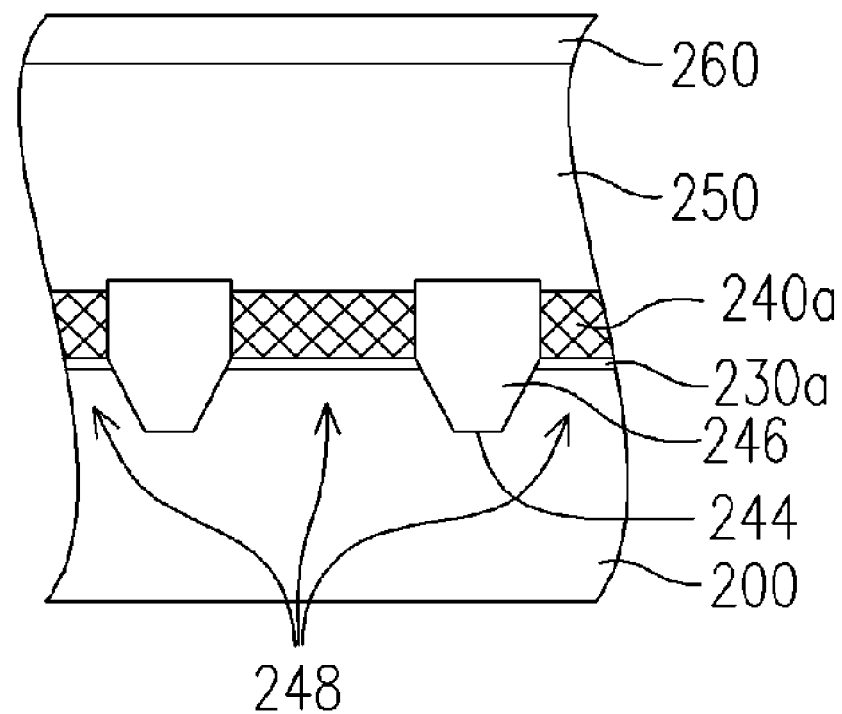

As shown in FIG. 2E, a dielectric layer 250 is formed on the substrate 200 to cover the isolation structure 246 and the conductive layer 240a. Then a dielectric layer 260 is further formed on the dielectric layer 250 to cover the dielectric layer 250. Here, the material of the dielectric layer 250 preferably has an etching selectivity different from that of the conductive layer 240a, the isolation structure 250 and the dielectric layer 260. In addition, the material of the dielectric layer 250, for example, is silicon nitride, and the dielectric layer 260 covering the isolation structure 250 is selective. The dielectric layer 260 can be used as the mask layer for etching the isolation structure 250. For example, the dielectric layer 260 is silicon oxide.

Figure 2F:
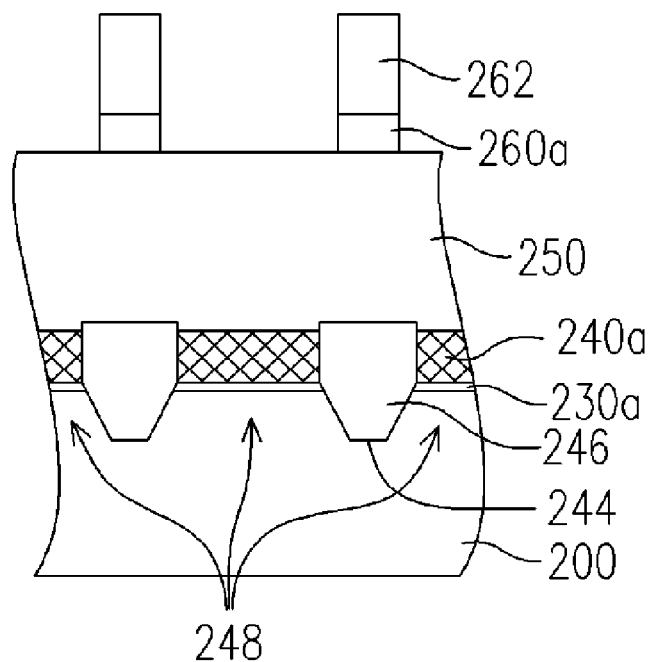

As shown in FIG. 2F, a patterned photoresist layer 262 is formed on the substrate 200, and then a portion of the dielectric layer 260 is removed by using the patterned photoresist layer 262 as a mask to form the mask layer 260a. The method of removing a portion of the dielectric layer 260, for example, is a dry etching process. Then, the patterned photoresist layer 262 is removed. The method of removing the patterned photoresist layer 262, for example, is an ashing process.

Figure 2G:
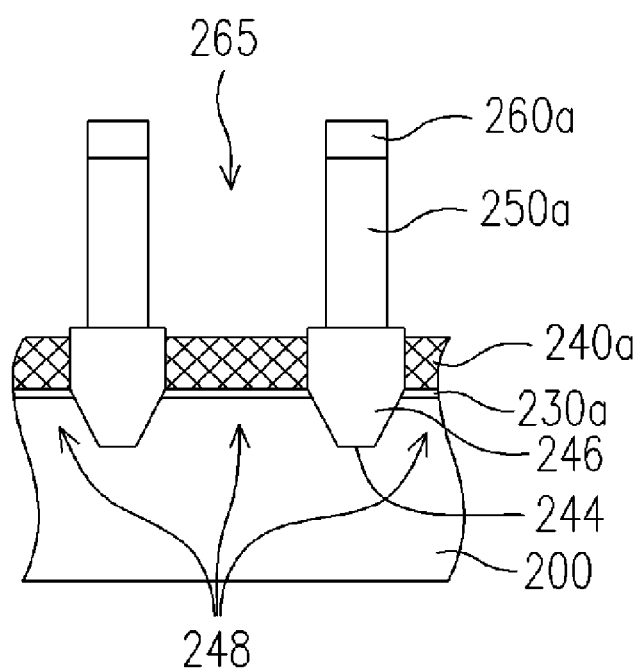

As shown in FIG. 2G, a portion of the dielectric layer 250 is removed by using the mask layer 260a as the mask to form the dielectric layer 250a and an opening 265 which exposes the conductive layer 240a. The method of removing a portion of the dielectric layer 250, for example, is a dry etching process.

Figure 2H:
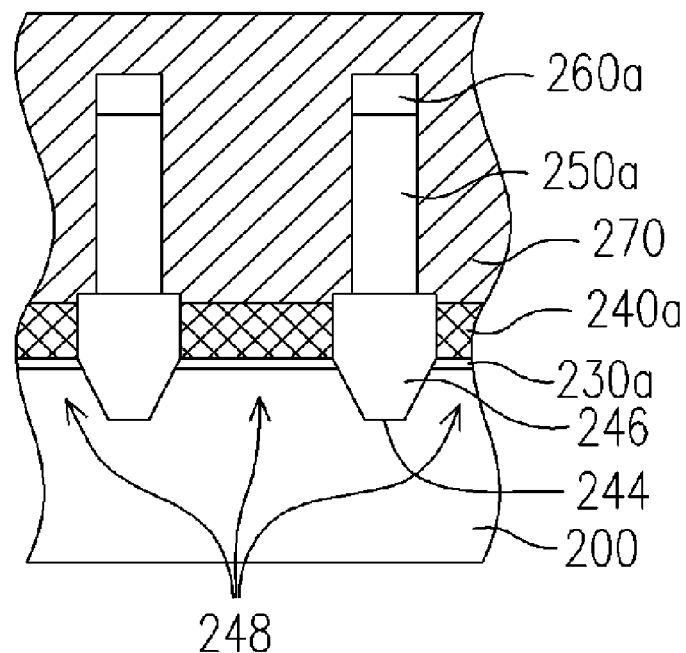

As shown in FIG. 2H, a conductive layer 270 is formed on the substrate 200. The material of the conductive layer 270, for example, is doped polysilicon or metal. And the forming method of the conductive layer 270, for example, is a physical vapor deposition (PVD) or a chemical vapor deposition (CVD) process.

Figure 2I:
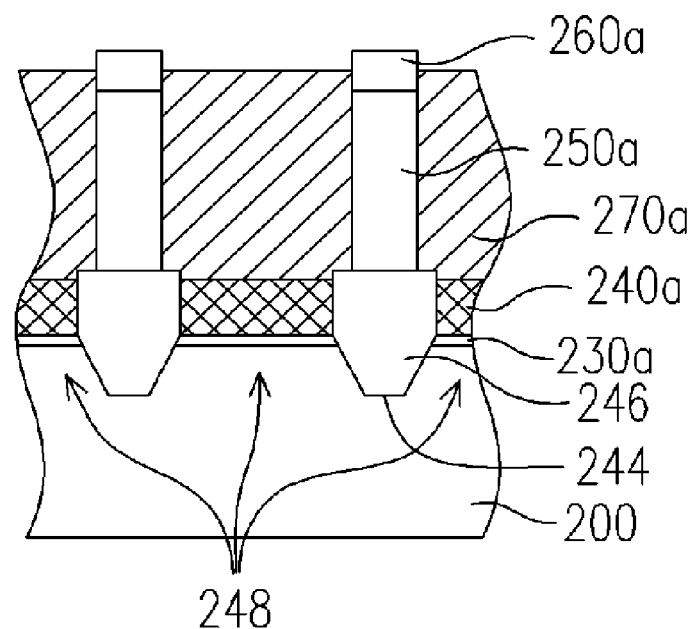

As shown in FIG. 2I, the dielectric layer 260a is used as the remove-stopping layer to remove a portion of the conductive layer 270, until the surface of the dielectric layer 260a is exposed and a plurality of conductive lines 270a are formed on the conductive layer 240a to electrically connect the devices. Wherein, the method of removing a portion of the conductive layer 270, for example, is a chemical mechanical polishing (CMP) or an etching back process. Wherein the formed conductive lines 270a, for example, are word lines (WL) in the memory array to electrically connect a plurality of semiconductor devices (not shown) located in the conductive layer 240a and the active area 248 covered by the conductive layer 240a.

In the fabricating process, the fabricating process of the dielectric layer 250 and the dielectric layer 260 are described as examples. Of course the present invention can also form the dielectric layer 250 only without the dielectric layer 260. Then the patterned photoresist is used as a mask to etch the dielectric layer 250 directly to form the opening 265 that exposes the conductive layer 240a.

Since the material of the dielectric layer 250 and the material of the isolation structure 246 have different etching selectivity, the isolation structure 246 can be used as a self-aligned mask when the dielectric layer 250 is patterned to form the openings 265 that expose the conductive layer 240a.

On the other hand, if the position of the exposing pattern shifts for some reason, since the etching selectivity of the conductive layer 240a and the selectivity of the dielectric layer 250 are different, the conductive layer 240 would not be damaged. Compared with the conventional technology, during the fabrication of conductive lines, the present invention can avoid the conductive layer 240a already formed on the substrate from damages.

In addition, since the fabricating method of the conductive line of the present invention is combined with the self-aligned shallow trench isolation (SASTI) process, the reliability of the whole structure can be further increased.

In an embodiment of the present invention, the material of conductive line 270a, for example, is polysilicon or metal. To further describe the fabricating method of the word line, the method can be applied to the fabrication of a trench device. Another fabricating process of the conductive line connecting the trench devices in the second embodiment is described as following.

Second Embodiment

Figure 3A:
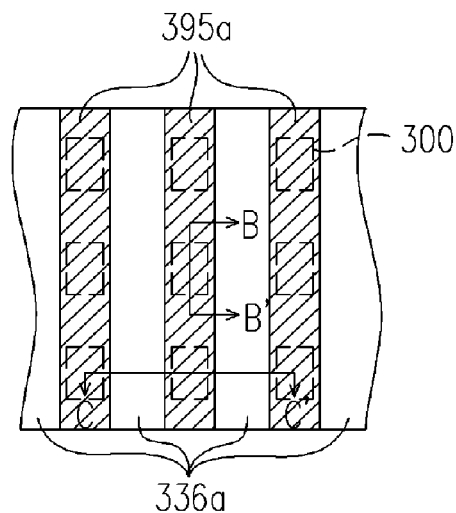
FIG. 3A is a schematic top view of an array with trench device, which schematically illustrates the top view of the word line fabricating process in the fabricating process of the array with trench device.
Figures 3B, 3C:
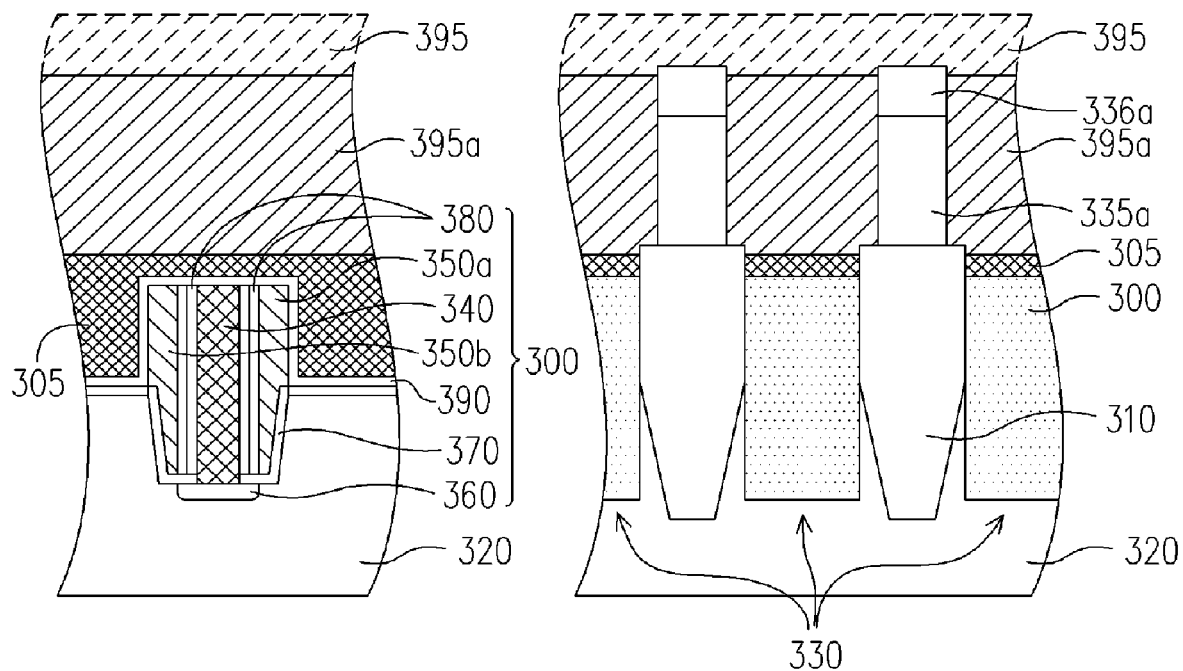
FIG. 3B is a schematic cross-sectional view along line B–B' in FIG. 3A, which schematically illustrates the cross-sectional view of the word line fabricating process in the fabricating process of the array with trench device.
FIG. 3C is a schematic cross-sectional view along line C–C' in FIG. 3A, which schematically illustrates the cross-sectional view of the word line fabricating process in the fabricating process of the array with trench device.

FIG. 3A is a schematic top view of an array with trench device, wherein the area circled by dotted line is where the trench device is located. FIG. 3B is a schematic cross-sectional view along line B–B' in FIG. 3A, which schematically illustrates the cross-sectional view of the word line fabricating process in the fabricating process of the array with trench device. FIG. 3C is a schematic cross-sectional view along line C–C' in FIG. 3A, which schematically illustrates the cross-sectional view of the word line fabricating process in the fabricating process of the array with trench device.

As shown in FIG. 3A to FIG. 3C, first, a substrate 320 is provided. A plurality of isolation structures 310 is formed in the substrate 320. And an active area 330 is defined between adjacent isolation structures 310. And the conductive layer 305 is formed in the active area 330. And a plurality of trench devices 300 are formed in the conductive layer. Wherein, the isolation structure 310 has a stripe layout, and the isolation structure 310 can be formed in an SASTI process or STI method, and the material of the isolation structure 310, for example, is silicon oxide. In addition, since the forming method of trench device 300 is known to those skilled in the art, it is not described herein.

As shown in FIG. 3B, in the present invention, the trench device 300, for example, is a trench flash memory cell. And the trench device 300 at least includes a tunneling oxide layer 370, a control gate 340, two floating gates 350a, 350b and a protection layer 390, etc.

Wherein, the tunneling oxide layer 370 is disposed on the surface of a trench in the active area 330. Two floating gates 350a, 350b are disposed on two sides of the control gate 340. A protection layer 390 covers on top of the control gate 340 and two floating gates 350a, 350b. In an embodiment, the trench device 300, for example, further includes an buried bit line 360 disposed in the substrate 320 of the trench, and the control gate 340 is disposed on the buried bit line 360. In addition, an inter-gate dielectric layer 380 can also be disposed between the control gate 340 and two floating gates 350a, 350b.

Next, the fabricating method of the conductive line in the first embodiment can be used in fabricating the conductive line 395a (word line).

That is, a dielectric layer 335 (not shown) is formed on the substrate 320. Then a dielectric layer 336 (not shown) is formed to cover on top of the dielectric layer 335. Next, the dielectric layer 336 is patterned to form the mask layer 336a. Then, a portion of the dielectric layer 335 is removed by using the mask layer 336a, so that the dielectric layer 335a and a plurality of openings 365 (not shown) which expose the trench devices and the active area 330 are formed. Wherein, the material of the dielectric layer 335, for example, has different etching selectivity from the isolation structure 310, conductive layer 305 and the mask layer 336a. In addition, the material of the dielectric layer 335, for example, is silicon nitride, and the material of the dielectric layer 336 covering the dielectric layer 335, for example, is silicon oxide.

Next, a conductive layer 395 is formed on the substrate 320. The material of the conductive layer 395, for example, is doped polysilicon or metal. And the forming method of conductive layer 395, for example, is a physical vapor deposition (PVD) method or a chemical vapor deposition (CVD) method.

Then, a portion of conductive layer 395 is removed by using the mask layer 336a as the remove-stopping layer until the surface of the mask layer 336a is exposed, so that a plurality of conductive lines 395a which fill up these openings 365 and electrically connect these trench devices are formed on the active area 330 in a self-aligned manner. In an embodiment, the method of removing a portion of conductive layer 395, for example, is a chemical mechanical polishing (CMP) or an etching back process. Wherein the formed conductive line 395a, for example, is the word line (WL) in the memory array, which electrically connects a plurality of trench devices 300 in the active area 330.

In the process, the fabricating process of the dielectric layer 335 and the dielectric layer 336 are described as an example. Of course the present invention can also form the dielectric layer 335 only without the dielectric layer 336. Then the patterned photoresist is used as the mask to etch the dielectric layer 335 directly to form the opening 365 that exposes the trench device 300.

Since the material of the dielectric layer 335 and the material of the isolation structure 310 have different etching selectivity, the isolation structure 310 can be used as a self-aligned mask when the dielectric layer 335 is patterned to form the openings 365 that expose the trench device 300.

On the other hand, if the position of the exposing pattern shifts for some reason, since the etching selectivity of the conductive layer 305 and the etching selectivity of the dielectric layer 335 are different, the trench device 300 will not be damaged when the opening 365 is formed in a dry etching process. Compared with the conventional technology, the present invention can avoid the trench device 300 formed on the substrate from damages when the word line is formed.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fabricating method of a conductive line, comprising:
   providing a substrate having at least two isolation structures already formed thereon, wherein a first conductive layer is formed between the two adjacent isolation structures;
   forming a first dielectric layer on the substrate;
   forming a patterned second dielectric layer on the first dielectric layer;
   patterning the first dielectric layer by using the patterned second dielectric layer as a mask to form a first opening exposing the first conductive layer;
   forming a second conductive layer on the substrate; and
   removing a portion of the second conductive layer outside the first opening to form a conductive line which electrically connects the first conductive layer.

2. The method of claim 1, wherein the material of the first conductive layer and the second conductive layer comprises doped polysilicon or metal.

3. The method of claim 1, wherein the step of forming the first conductive layer and the second conductive layer comprises using a physical vapor deposition (PVD) process or a chemical vapor deposition (CVD) process.

4. The method of claim 1, wherein the step of removing a portion of the second conductive layer comprises using a chemical mechanical polishing process or an etching back process.

5. The method of claim 1, wherein the step of forming the isolation structures comprises using a shallow trench isolation (STI) process.

6. The method of claim 1, wherein the material of the first dielectric layer and the second dielectric layer comprises a material with an etching selectivity different from the first conductive layer.

7. The method of claim 1, wherein the material of the first dielectric layer comprises a material with an etching selectivity different from the second dielectric layer.

8. The method of claim 1, wherein the material of the first dielectric layer comprises a material with an etching selectivity different from the isolation structure.

9. The method of claim 1, wherein the material of the first dielectric layer comprises silicon nitride.

10. The method of claim 1, wherein the material of the second dielectric layer comprises silicon oxide.

11. The method of claim 1, further comprising forming a plurality of trench devices in the first conductive layer before forming the dielectric layer on the substrate, and each of the trench devices comprising:

a tunneling oxide layer disposed on the surface of a trench in the substrate;

a control gate;

two floating gates disposed on two sides of the control gate; and an inter-gate dielectric layer disposed between the control gate and the two floating gates.

12. The method of claim 1, wherein the conductive line is a word line.

13. The method of claim 1, wherein the step of forming the isolation structures and the first conductive layer comprises:

forming a conductive material layer on the substrate;

forming a mask layer on the conductive material layer;

patterning the mask layer and the conductive material layer to form a patterned mask layer, the first conductive layer and at least two second openings exposing the substrate;

removing a portion of the substrate by using the patterned mask layer as a mask to form at least two trenches in the substrate;

forming an insulator material layer on the substrate;

removing a portion of the insulator material layer by using a chemical mechanical polishing process until the patterned mask layer being exposed; and removing the patterned mask layer.

14. A fabricating method of conductive line, comprising:

providing a substrate;

forming a conductive material layer and a mask layer on the substrate in sequence;

patterning the mask layer and the conductive material layer to form a patterned mask layer, a first conductive layer and at least two first openings exposing the substrate;

removing a portion of the substrate by using the patterned mask layer as a mask to form at least two trenches in the substrate;

forming an insulator material layer in the two trenches;

removing the patterned mask layer;

forming a first dielectric layer on the substrate;

forming a patterned second dielectric layer on the first dielectric layer;

patterning the first dielectric layer by using the patterned second dielectric layer as a mask to form a second opening between the dielectric material layers, and the second opening exposing the first conductive layer;

forming a second conductive layer in the second opening; and removing a portion of the second conductive layer outside the second opening to form a conductive line which electrically connects the first conductive layer.

15. The method of claim 14, wherein the material of the first dielectric layer comprises a material with an etching selectivity different from that of the second dielectric layer.

16. The method of claim 15, wherein the material of the second dielectric layer comprises silicon oxide.

17. The method of claim 14, wherein the material of the first dielectric layer comprises a material with an etching selectivity different from the first conductive layer and the insulating material.

18. The method of claim 14, wherein the material of the first dielectric layer comprises silicon nitride.

19. The method of claim 14, wherein the material of the first conductive layer and the second conductive layer comprises doped polysilicon or metal.

20. The method of claim 14, wherein the step of forming the first conductive layer and the second conductive layer comprises using a physical vapor deposition (PVD) process or a chemical vapor deposition (CVD) process.

21. The method of claim 14, wherein the step of removing a portion of the second conductive layer comprises using a chemical mechanical polishing process or an etching back process.

22. The method of claim 14, further comprising forming a plurality of trench devices in the first conductive layer before the first dielectric layer being formed on the substrate, and each of the trench devices comprising:

a tunneling oxide layer disposed on the surface of a trench in the substrate;

a control gate;

two floating gates disposed on two sides of the control gate; and an inter-gate dielectric layer disposed between the control gate and the two floating gates.

23. The method of claim 14, wherein the conductive line is a word line.

* * * * *